United States Patent [19]

Schwarzbauer

[11] Patent Number: 5,158,226
[45] Date of Patent: Oct. 27, 1992

[54] METHOD AND ARRANGEMENT FOR CONNECTING A SEMICONDUCTOR TO A SUBSTRATE OR FOR AFTER-TREATMENT OF A SEMICONDUCTOR-TO-SUBSTRATE CONNECTION WITH CONTACT-FREE PRESSING

[75] Inventor: Herbert Schwarzbauer, Munich, Fed. Rep. of Germany

[73] Assignee: Siemens Aktiengesellschaft, Munich, Fed. Rep. of Germany

[21] Appl. No.: 643,507

[22] Filed: Jan. 22, 1991

[30] Foreign Application Priority Data

Jun. 6, 1990 [DE] Fed. Rep. of Germany ....... 4018131

[51] Int. Cl.⁵ ............................................. B23K 20/02
[52] U.S. Cl. ................................. 228/106; 228/243; 228/5.5
[58] Field of Search ............... 228/243, 106, 5.5, 194, 228/123, 124, 237, 175, 176, 193

[56] References Cited

U.S. PATENT DOCUMENTS

| | | | |
|---|---|---|---|
| 3,608,809 | 8/1968 | Cushman | 228/106 |
| 3,699,640 | 10/1972 | Cranston et al. | 228/106 |
| 3,964,666 | 6/1976 | Dinella et al. | 228/106 |
| 4,159,921 | 7/1979 | Inohara et al. | 228/243 |
| 4,638,937 | 1/1987 | Belanger, Jr. | 228/106 |
| 4,810,672 | 3/1989 | Schwarzbauer | 437/209 |
| 4,903,885 | 2/1990 | Schwarzbauer | 228/106 |
| 4,903,886 | 2/1990 | Schwarzbauer | 228/106 |

FOREIGN PATENT DOCUMENTS 0330895  2/1989  European Pat. Off.
0330896  2/1989  European Pat. Off.

OTHER PUBLICATIONS

Patent Abstracts of Japan; Publication No. 55103731; Koyama Osamu; "Manufacture of Semiconductor Device", Published Aug. 8, 1980.
Patent Abstracts of Japan; Publication No. 58068942; Takehashi Nobuhaya; "Die Bonding Device", Published Apr. 25, 1983.

*Primary Examiner*—Richard K. Seidel
*Assistant Examiner*—James Miner
*Attorney, Agent, or Firm*—Hill, Van Santen, Steadman & Simpson

[57] ABSTRACT

The invention is directed to a method wherein pressure is exerted onto a semiconductor surface by a chemically inert and non-solid medium. An opposite pressure is prevented from building up in an intermediate layer, for example, with the assistance of a seal. A connection between the semiconductor and the substrate occurs by pressure sintering or by diffusion welding. A contact between an active, inside region of the semiconductor and a plunger can be avoided since the plunger has a raised and annular outside region for sealing, and the actual pressing power is effected by the pressure medium via a bore situated in the plunger. This raised edge for sealing can also be situated on the semiconductor instead of being situated on the plunger. When a semiconductor component is extrusion-coated with a plastic melt, then this plastic melt itself can serve as a pressure medium.

19 Claims, 3 Drawing Sheets

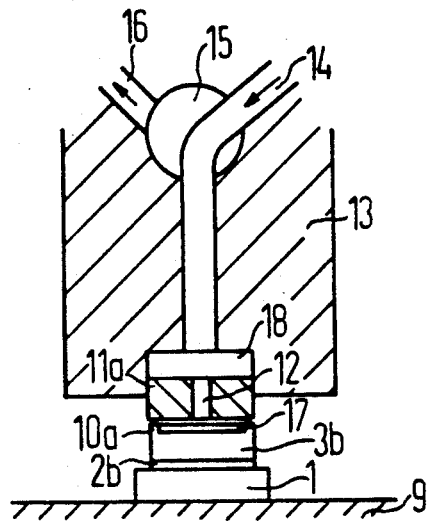
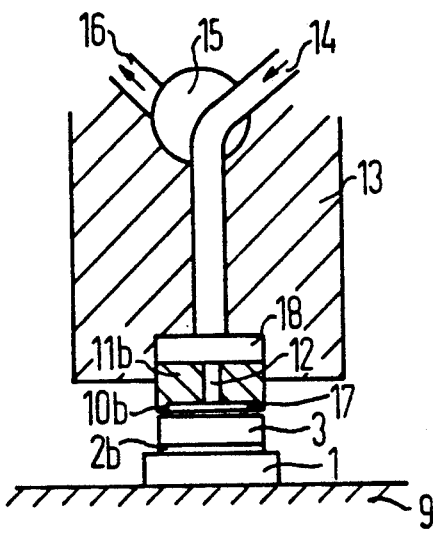
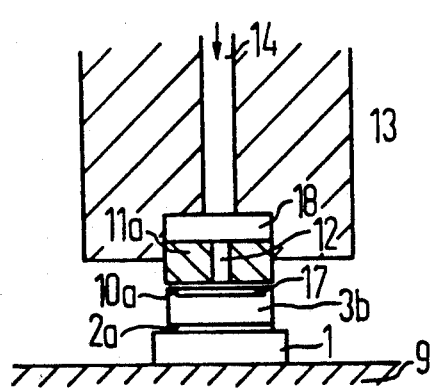
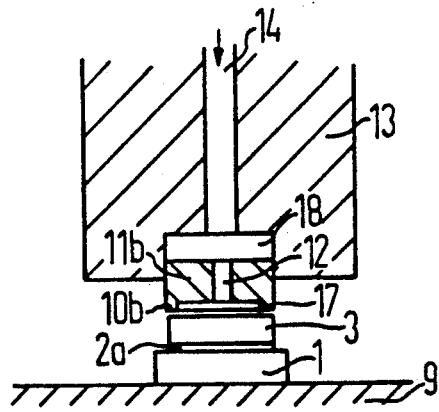

METHOD AND ARRANGEMENT FOR CONNECTING A SEMICONDUCTOR TO A SUBSTRATE OR FOR AFTER-TREATMENT OF A SEMICONDUCTOR-TO-SUBSTRATE CONNECTION WITH CONTACT-FREE PRESSING

BACKGROUND OF THE INVENTION

The invention is directed to methods for connecting a semiconductor to a substrate, or for the after-treatment of a semiconductor-to-substrate connection by pressing, and is also directed to arrangements for the implementation thereof.

Semiconductors are often connected to metal substrates to increase the mechanical stability and for better heat elimination. Bonding techniques such as gluing or soldering that are fast, inexpensive, and that can be implemented in fully automated fashion are usually employed for that purpose. The temperature resistance and the resistance to thermal shocks, however, are thereby limited, particularly given chip sizes having an edge length of several millimeters. The thermal and electrical resistance of the glue also has a disadvantageous effect when gluing semiconductors and, in particular, in power semiconductors.

A high-strength connection can be achieved with low thermal and electrical resistance by pressure sintering a silver powder layer according to EP-A-242 626, corresponding to U.S. Pat. No. 4,810,672, issued Mar. 7, 1989, incorporated herein. A pressing power is thereby respectively applied by rigid dies on the parts to be connected. In this pressing process, the upper side of the semiconductor is entirely contacted by a pressure-transmitting, solid medium.

EP-330 896, corresponding to U.S. Pat. No. 4,903,886, issued Feb. 27, 1990, and EP-330 895, corresponding to U.S. Pat. No. 4,903,885, issued Feb. 27, 1990, both incorporated herein, further disclose that the substrate and the semiconductor be embedded in an elastic centering form of, for example, silicone rubber which transmits the pressure power of a movable die since it completely fills out the interior of a receptacle chamber in which the substrate and the semiconductor member are situated. The pressure power remains when the sintering pressure is reached. In this known pressing process, a contact between a solid medium and the upper side of the semiconductor member is needed. However, contaminations of the semiconductor surface frequently arise.

SUMMARY OF THE INVENTION

An object of the invention is to specify methods of the type initially cited wherein semiconductors are connected to substrates by pressing in an advantageous way, or semiconductor-to-substrate connections that are already pre-connected are after-treated by pressing in an advantageous way.

According to the invention, a method is provided for influencing a connection of a semiconductor to a substrate. A pressure power is exerted by use of a chemically inert and non-solid medium to press the semiconductor.

Advantages obtainable with the invention are: 1) that the active surface of the semiconductor is not contacted by parts lying against it and is not contaminated, 2) that no mechanical stress spikes occur in the semiconductor material, and 3) that a plurality of semiconductor-to-substrate connections can also be produced or after-treated in one working cycle.

Preferred exemplary embodiments of the invention are set forth in greater detail below with reference to the drawings.

BRIEF DESCRIPTION OF THE DRAWINGS

FIG. 5a is a first arrangement for the implementation of the first method of the invention;

FIG. 5b is a second arrangement for the implementation of the first method of the invention;

FIG. 6a is a first arrangement for the implementation of the second method of the invention;

FIG. 6b is a second arrangement for the implementation of the second method of the invention;

DESCRIPTION OF THE PREFERRED EMBODIMENTS

Figure 1:
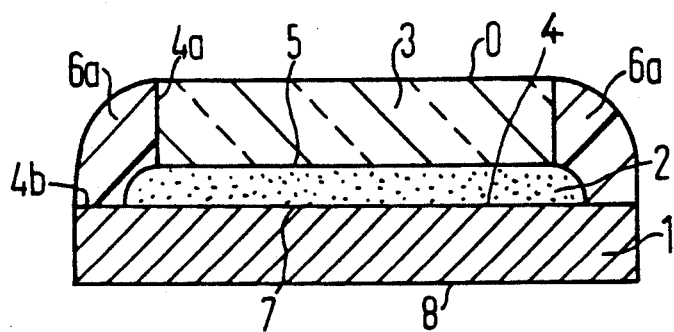
FIG. 1 is a first illustration for explaining a first method of the invention.

In a first method, as shown in FIG. 1 a substrate 1 composed, for example, of molybdenum, is provided with an intermediate layer 2. A semiconductor 3 is in turn applied on this intermediate layer 2. The intermediate layer 2 lies between the semiconductor surface 5 and the substrate surface 7 which may be potentially pre-treated, and is itself composed of a powder having good thermal and electrical conductivity, for example silver powder, that, for example, is present in the form of a pre-sintered film. The lateral edge surface 4a of the semiconductor 3, as shown in FIG. 1, is, in accordance with the invention, glued to an annular outside region 4b of the substrate surface 4 with an annular, elastic bead 6a, for example a silicone bead, and is sealed.

Figure 2:
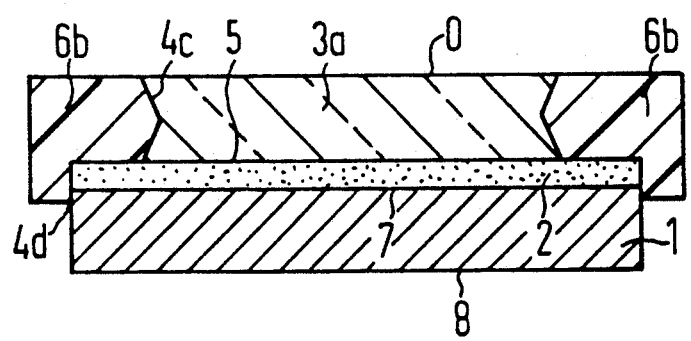
FIG. 2 is a second illustration for explaining the first method of the invention.

Instead of the elastic bead 6a shown in FIG. 1, an annular edge passivation 6b of a semiconductor 3a shown in FIG. 2 can be employed. For this purpose, the edge passivation 6b is formed of a soft and elastic plastic, for example silicone, and is shaped such that the lateral edge surface 4c of the semiconductor 3a which has an indentation for better fastening is connected to a region 4d of the lateral edge surface of the substrate 1 and is sealed.

Figure 3:
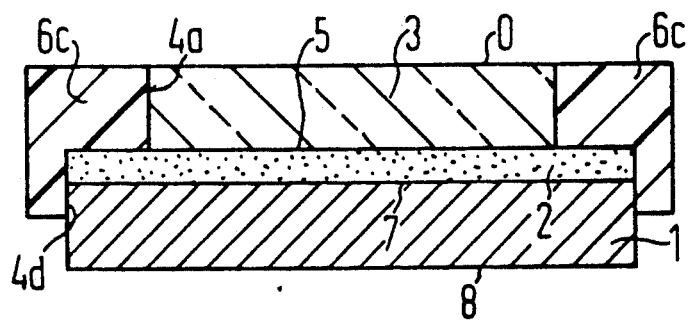
FIG. 3 is a third illustration for explaining the first method of the invention.

When no edge passivation is present, a pre-shaped ring 6c formed of a soft and elastic plastic, for example silicone, can be employed as shown in FIG. 3. The plastic ring 6c can be applied both after the application of the semiconductor 2 onto the intermediate layer 2, or in common with the semiconductor 3. When the plastic ring 6c has been applied, then it must seal the region between the lateral edge surface 4a of the semiconductor 3 and the region 4d of the lateral edge surface of the substrate.

In a following method step of the invention, the arrangements composed of semiconductor 3 or 3a, intermediate layer 2, and substrate 1 provided with seals 6a, 6b, or 6c, are introduced into an apparatus referred to as an autoclave. An autoclave is a heatable pressure vessel that, in this case, must be designed for a pressing power of 300 through 400 bar, and that should ideally have an internally disposed heating. Systems for hot-isostatic pressing (HIP) are especially suitable for this purpose.

The pressing power of a chemically inert and non-solid medium, for example nitrogen or argon as a gaseous medium or silicone oil as a liquid medium, which is situated in the autoclave respectively causes pressing powers onto a surface 0 of the semiconductor 3 or 3a, and onto a surface 8 of the respective substrate 1. The seals 6a, 6b, or 6c prevent the creation of an opposing pressure in the intermediate layer 2. No opposing forces onto the surfaces 5, 7 can thus be effected and, consequently, the arrangement formed of semiconductor, intermediate layer, and substrate is pressed together. The intermediate layer 2 is highly compressed as a result of the pressing power, and a connection arises on the basis of pressure sintering.

When an intermediate layer 2 is not employed and only the potentially pre-treated semiconductor surface 5 and potentially pre-treated substrate surface 7 are pressed against one another, then a connection occurs in a corresponding fashion on the basis of diffusion welding. For example, the pre-treatment of the surfaces 5, 7 here can occur by electro-deposition or vapor deposition of a precious metal contacting layer.

Figure 4:
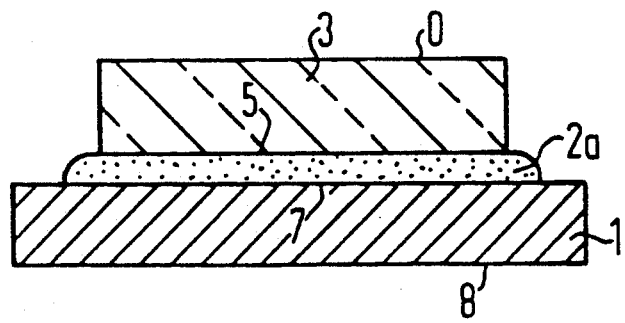
FIG. 4 is an illustration for explaining a second method of the invention.

In a semiconductor-to-substrate connection shown in FIG. 4 that has already been pre-connected, an after-sintering for increasing the bonding strength can be effected with a second method of the invention with the assistance of an after-treatment by contact-free pressing and at a suitable temperature. The pre-connecting of the semiconductor-to-substrate connection thus likewise occurs, for example by contact-free pressing. A seal between the semiconductor 3 and the substrate 1 is not required, particularly in power semiconductors, since the penetration rate in the compressed intermediate layer 2a formed, for example, of silver powder is so slight even given a gaseous pressure medium, that a pressure compensation does not occur until after several minutes in semiconductor components such as, for example, in power semiconductor components. As in the first method, the pressing thus occurs in an autoclave.

Since a uniform pressure prevails in the autoclave, a large number of semiconductors can be joined to substrates simultaneously, or a large number of pre-connected semiconductor-to-substrate connections can be simultaneously after-treated.

The first method of the invention can likewise be implemented in an arrangement described in FIG. 5a or, respectively, FIG. 5b. In this arrangement, the semiconductor 3b or 3 is situated on a heating block 9 for heating. As shown in FIG. 5a, the semiconductor 3b has a slightly raised, annular outside region 10a on which a bored plunger 11a without a raised outside region presses. For this purpose, the outside region can, for example, be formed of silicone lacquer. In the arrangement shown in FIG. 5b by contrast, a bored plunger 11b has a slightly raised, annular outside region and the semiconductor 3 instead has no corresponding outside region. When connecting on the basis of pressure sintering, the semiconductors 3b and 3 can be coated with a sinterable intermediate layer 2b, for example with a silver sponge. The bored plungers 11a and 11b each respectively comprise a bore 12 that connects an inside region 17 annularly surrounded by the corresponding outside region 10a or 10b to the cylinder interior 18 of a cylinder 13. A three-way cock 15 permits an optional connection between the cylinder interior 18 and an intake 14 or a discharge 16.

For the implementation of the first method of the invention, the substrate 1 on the heating block 9 is pre-heated, and the bored plunger 11a or 11b is placed onto the semiconductor 3b or 3 such that a seal is effected between the bored plunger 11a or 11b and the semiconductor 3b or 3. When the discharge 16 is now connected to the cylinder interior 18 with the three-way cock 15, then the cylinder interior 18 and, via the bore 12 the inside region 17 as well, are evacuated. This causes a suctioning of the semiconductor 3b or 3. Together with the plunger 11a or 11b and the cylinder 13, the semiconductor 3b or 3 can now be exactly positioned on the substrate 1 before the intake 14 is connected to the cylinder interior 18 with the assistance of the three-way cock 15 and the pressing power of the chemically inert and non-solid medium, for example nitrogen or argon as a gaseous medium, and silicone oil as a liquid medium. This medium is built up in the interior 17 between the plunger and the semiconductor and presses the latter onto the pre-heated substrate 1 in a contact-free manner.

As shown in FIGS. 6a or 6b, the arrangement for the implementation of the second method of the invention comprises an immediate connection between the intake 14 for the chemically inert and non-solid medium and the cylinder interior 18, since a suctioning for exact positioning is eliminated in the implementation of the second method of the invention. This is because the substrate 1 is directly pre-joined to the semiconductor 3b or 3, or is already pre-connected thereto by a pre-compressed intermediate layer 2a to form a semiconductor-to-substrate connection.

Given semiconductor components having an injected plastic housing, the plastic melt required for the manufacture thereof, for example a hot-curing synthetic resin, can be simultaneously utilized as the chemically inert and non-solid medium for the first or second method of the invention. This is possible since the extrusion-coating occurs at temperatures around 200° C. and at a pressure of several hundred bar, given a holding time of a few minutes.

Figure 7:
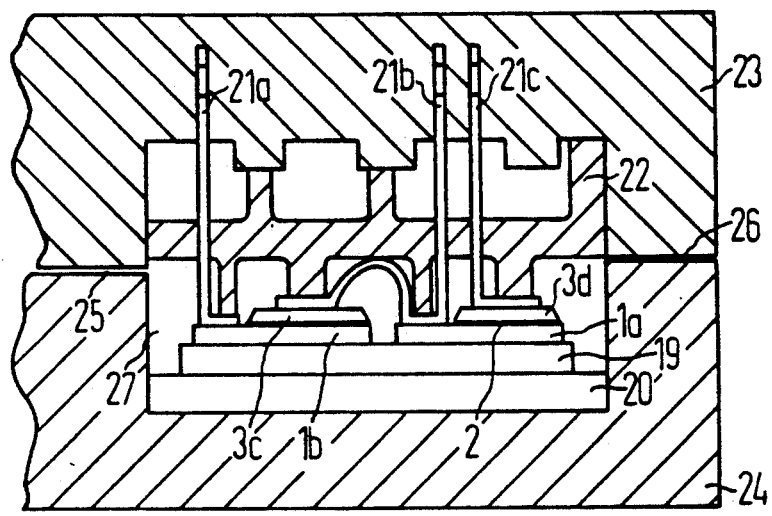
FIG. 7 is another arrangement for the implementation of the first or of the second method of the invention.

FIG. 7 shows an arrangement for the implementation of the first or second method of the invention, whereby the injection pressure of a plastic melt connects the semiconductors 3c and 3d to the substrates 1b and 1a on the basis of an intermediate layer 2, or for after-treatment of the already existing semiconductor-to-substrate connections 3c, 1b and 3d, 1a. The arrangement shown in FIG. 7 is particularly employed for producing semiconductor modules and is essentially formed of an upper injection mold 23 and of a lower injection mold 24 that together form an injection chamber 27 connected to an injection channel 25 which delivers the plastic melt. A thin aeration channel 26 is also provided. Before every injection process, a bottom plate 20 is situated in the injection mold. An insulating layer 19 is placed thereon. The insulating layer in turn carries the substrates 1b and 1a, together with the semiconductors 2c and 3d already connected or to be connected by the intermediate layer 2. The parts that may be pre-treated for connecting, and which are provided with leads 21a through 21c, are held and centered by adjustment parts 22 of plastic.

In the implementation of the first or second method of the invention, the plastic melt present under the injection pressure penetrates through the injection channel 25 into the injection chamber 27, flows around the parts situated in the injection chamber, and exerts a hydrostatic pressure which, due to its high viscosity, doesn't penetrate into the intermediate layer 2 and erects an opposing pressure.

Figure 8:
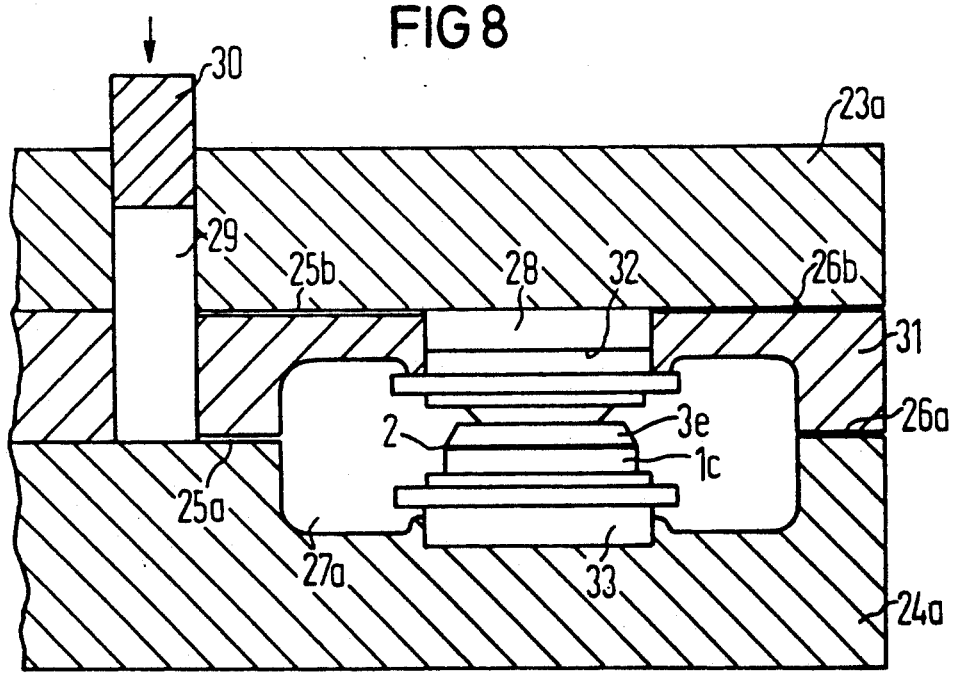
FIG. 8 is a further arrangement for the implementation of the first or of the second method of the invention.

FIG. 8 shows a further arrangement for the implementation of the first or second method of the invention, wherein the injection pressure of a plastic melt connects a semiconductor 3e to a substrate 1c on the basis of an intermediate layer, or is provided for after-treatment of the already existing semiconductor-to-substrate connection 3e, 1c. The arrangement shown in FIG. 8 is particularly employed for producing semiconductor components having a wafer housing, and is essentially formed of an upper injection mold 23a, of an intermediate mold 31, and of a lower injection mold 24a that together form an injection chamber 27a. The injection chamber 27a is connected via an injection channel 25a to a pressing chamber 29 that comprises a plunger 30. Since the injection chamber 27a only annularly surrounds the arrangement formed of an upper contact piece 32, the semiconductor 3e, the substrate 1c, and a lower contact piece 33, no pressing powers can be exerted onto the contact pieces 32, 33 by the plastic melt of the injection chamber. In order to likewise effect a pressing power by the plastic melt given this arrangement, an auxiliary chamber 28 connected to the pressing chamber 29 via an auxiliary injection channel 25b is present according to the invention. The connection of the auxiliary chamber to the pressing chamber could also be indirectly formed, for example, by an auxiliary injection channel between the auxiliary chamber and the injection chamber. When, for example given a specific semiconductor-to-substrate arrangement, one auxiliary chamber is not adequate, then a plurality of auxiliary chambers directly or indirectly connected to the pressing chamber can be provided. The injection chamber 27a comprises a thin aeration channel 26a, and the auxiliary chamber 28 comprises a thin auxiliary aeration channel 26b, whereby both aeration channels 26a, 26b must be so thin that the plastic melt cannot emerge.

For the implementation of the first or second method of the invention, the arrangement composed of upper contact piece 32, of the semiconductor 3e, of the substrate 1c, and of the lower contact piece 33 is introduced into the lower injection mold 24a. The intermediate form 31 is subsequently put in place, and the injection mold is closed by the upper injection mold 23a. Subsequently, the pressing chamber is filled with the plastic to be injected and the melt is injected into the mold. The injection mold is opened after the curing of the plastic melt, the plastic material of the auxiliary chamber is removed from the component, and the finished component is taken from the injection mold.

One pressing chamber can thus simultaneously supply a plurality of injection molds with the plastic melt so that a plurality of components can be extrusion-coated in one working cycle.

The first and second methods of the invention are predominantly conceived for processing entire semiconductor wafers, but can also be applied to semiconductor chips without a problem.

Although various minor changes and modifications might be proposed by those skilled in the art, it will be understood that I wish to include within the claims of the patent warranted hereon all such changes and modifications as reasonably come within my contribution to the art.

I claim as my invention:

1. A method for connecting a semiconductor to a substrate by pressing, comprising the steps of:
   sealing gaps between the substrate and the semiconductor;
   thereafter joining the semiconductor to the substrate in a temperature-resistant, thermally insulating and pressure-resistant vessel with a pressure prevailing in the vessel; and
   extending a pressing power required for the connecting by a chemically inert and non-solid medium.

2. A method according to claim 1 including the step of sealing the gaps between the substrate and the semiconductor by a bead formed of a soft, temperature-resistant solid that simultaneously elastically glues and joins the semiconductor and the substrate to one another.

3. A method according to claim 1 including the step of sealing the gaps between the semiconductor and the substrate by a prefabricated ring formed of a soft, temperature-resistant solid.

4. A method according to claim 1 including the step of designing a preceding, annular edge passivation of the semiconductor such that the gaps between the semiconductor and the substrate are simultaneously sealed therewith.

5. A method according to claim 1 wherein a plurality of semiconductors are pressed onto at least one substrate in one working cycle.

6. A method according to claim 1 wherein means provided for said sealing of the gaps are also simultaneously employed for aligning the semiconductor on the substrate.

7. A method according to claim 1 wherein means provided for said sealing of the gaps are also simultaneously employed for fixing the semiconductor on the substrate.

8. A method according to claim 1 including the steps of providing a loose, bored plunger in a cylinder and pressing the bored plunger against the semiconductor such that a seal between the plunger and the semiconductor is effected by a slightly raised annular outside region of the semiconductor, and pressing said chemically inert and non-solid medium situated in the cylinder through the bored plunger and filling out a sealed interior between the plunger and the semiconductor such that an inside region of the semiconductor is pressed in contact-free fashion against the substrate.

9. A method according to claim 8 wherein, when joining the semiconductor to the substrate, causing a suctioning of the semiconductor by an under-pressure in an interior of the cylinder via the bored plunger in order to subsequently position said semiconductor.

10. A method according to claim 8 including the step of providing the plunger as a temperature-resistant and thermally insulating material.

11. A method according to claim 10 including the step of providing the plunger as an elastic plastic.

12. A method according to claim 1 including the steps of providing a loose, bored plunger in a cylinder and pressing the bored plunger against the semiconductor such that a seal between the plunger and the semiconductor is effected by a slightly raised, annular outside region of the plunger, and pressing said chemically inert and non-solid medium situated in the cylinder through the bored plunger and filling out a sealed interior between the plunger and the semiconductor such that an inside region of the semiconductor is pressed in contact-free fashion against the substrate.

13. A method according to claim 12 wherein, when joining the semiconductor to the substrate, causing a suctioning of the semiconductor by an under-pressure in an interior of the cylinder via the bored plunger in order to subsequently position said semiconductor.

14. A method according to claim 12 including the step of providing the plunger as a temperature-resistant and thermally insulating material.

15. A method according to claim 14 including the step of providing the plunger as an elastic plastic.

16. A method according to claim 12 wherein a plurality of semiconductors are pressed onto at least one substrate in one working cycle.

17. A method according to claim 1 including the steps of causing the pressing power by a liquid plastic melt, and whereby after curing, the plastic melt remains connected to the semiconductor and the substrate and is a part of a finished component.

18. A method according to claim 17 including the steps of providing at least one auxiliary chamber in an injection mold in addition to an injection chamber, and connecting the auxiliary chamber and the injection chamber to a pressing chamber via channels; and arranging the auxiliary chamber for achieving a desired pressing power onto the semiconductor and onto the substrate.

19. A method according to claim 17 wherein the liquid plastic melt heats the semiconductor and the substrate to a desired temperature.

* * * * *